United States Patent
Coumou

(10) Patent No.: US 8,395,322 B2
(45) Date of Patent: *Mar. 12, 2013

(54) PHASE AND FREQUENCY CONTROL OF A RADIO FREQUENCY GENERATOR FROM AN EXTERNAL SOURCE

(75) Inventor: David J. Coumou, Webster, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/241,650

(22) Filed: Sep. 23, 2011

(65) Prior Publication Data

US 2012/0013253 A1  Jan. 19, 2012

Related U.S. Application Data

(63) Continuation of application No. 12/552,603, filed on Sep. 2, 2009, now Pat. No. 8,110,991, which is a continuation of application No. 11/108,626, filed on Apr. 18, 2005, now Pat. No. 7,602,127.

(51) Int. Cl.
*H05B 31/26* (2006.01)

(52) U.S. Cl. ............................ 315/111.21; 315/111.41

(58) Field of Classification Search ............. 315/111.21, 315/111.41, 261, 326; 219/121.43, 121.54; 118/723 I, 723 R See application file for complete search history.

(56) References Cited

U.S. PATENT DOCUMENTS

| 5,057,185 | A | 10/1991 | Thomas, III et al. |
| 5,116,482 | A | 5/1992 | Setoyama et al. |
| 5,175,472 | A | 12/1992 | Johnson, Jr. et al. |
| 5,195,045 | A | 3/1993 | Keane et al. |
| 5,228,939 | A | 7/1993 | Chu |
| 5,436,424 | A | 7/1995 | Nakayama et al. |
| 5,556,549 | A | 9/1996 | Patrick et al. |
| 5,565,737 | A | 10/1996 | Keane |
| 5,573,595 | A | 11/1996 | Dible |
| 5,688,357 | A | 11/1997 | Hanawa |
| 5,824,606 | A * | 10/1998 | Dible et al. ................... 438/729 |
| 6,252,354 | B1 * | 6/2001 | Collins et al. ............ 315/111.51 |
| 6,707,255 | B2 * | 3/2004 | Coumou et al. ......... 315/111.41 |
| 6,852,277 | B2 | 2/2005 | Platt, Jr. et al. |
| 6,873,114 | B2 | 3/2005 | Avoyan et al. |
| 6,885,153 | B2 * | 4/2005 | Quon ....................... 315/111.31 |

(Continued)

FOREIGN PATENT DOCUMENTS

| JP | 3107456 A | 5/1991 |
| JP | 2003273602 A | 9/2003 |

(Continued)

OTHER PUBLICATIONS

Japanese Office Action for Japanese Patent Application No. 2005-329021 dated Mar. 29, 2011.

*Primary Examiner* — Tung X Le

(74) *Attorney, Agent, or Firm* — Harness, Dickey & Pierce, P.L.C.

(57) ABSTRACT

A first radio frequency (RF) generator includes a first RF power source that generates an RF power output. A first sensor generates at least one sensor signal based on the RF power output. A first signal processing unit generates magnitude and phase signals associated with the at least one sensor signal. A second signal processing unit generates a first control signal to control a frequency and a phase of the first RF power source based on the magnitude and phase signals. The first RF power source determines, based on the magnitude signals, whether to generate the RF power output in response to the first control signal or in response to a second control signal received from a second RF generator.

25 Claims, 3 Drawing Sheets

U.S. PATENT DOCUMENTS

| | | |
|---|---|---|
| 6,887,339 B1 | 5/2005 | Goodman et al. |
| 7,096,819 B2 * | 8/2006 | Chen et al. .................. 119/723 I |
| 7,345,428 B2 | 3/2008 | Turner |
| 7,602,127 B2 | 10/2009 | Coumou |
| 2002/0026251 A1 * | 2/2002 | Johnson et al. ................. 700/67 |
| 2002/0171411 A1 | 11/2002 | Nasman |
| 2005/0135532 A1 * | 6/2005 | Taleyarkhan et al. ......... 376/100 |

FOREIGN PATENT DOCUMENTS

| | | |
|---|---|---|
| WO | 2004/008502 A2 | 1/2004 |

\* cited by examiner

PHASE AND FREQUENCY CONTROL OF A RADIO FREQUENCY GENERATOR FROM AN EXTERNAL SOURCE

CROSS REFERENCE TO RELATED APPLICATIONS

This application is a continuation of U.S. patent application Ser. No. 12/552,603, filed on Sep. 2, 2009 which is a continuation of U.S. patent application Ser. No. 11/108,626, filed on Apr. 18, 2005 now U.S. Pat. No. 7,602,127 issued on Oct. 13, 2009. The entire disclosures of the above applications are incorporated herein by reference.

FIELD OF THE INVENTION

The present invention generally relates to a radio frequency (RF) generator and, more particularly, to phase and frequency control of a RF generator.

BACKGROUND OF THE INVENTION

Plasma etching is frequently used in semiconductor fabrication. In plasma etching, ions are accelerated by an electric field to etch exposed surfaces on a substrate. To effectively execute a plasma etching process, the power delivered from a radio frequency (RF) generator to the plasma chamber must be precisely controlled. An example of an RF generator for use in an RF plasma system may be found with respect to U.S. Pat. No. 6,707,255, issued on Mar. 16, 2004, the disclosure of which is incorporated by reference in its entirety herein.

A RF generator system typically includes a RF power source, a RF sensor, and a sensor signal processing unit. The RF power source generates RF power signals detected by the sensor. The sensor outputs analog sensor signals representative of the RF power signals. The analog sensor signals include a frequency of interest and a plurality of interfering frequency components. The sensor signal processing unit band limits the analog sensor signal to remove interfering frequency components from the analog sensor signal, thereby leaving an analog or digital representation of the frequency of interest.

It is desirable to accurately control the frequency and the phase of RF generators. For example, the typical phase offset for fixed or agile frequency of RF generators is not controlled. Phase values derived from a linear combination of the RF sensor signals also are typically not adequately controlled. Moreover, conventional RF generators do not externally control a variable phase offset, such as in an agile frequency RF auto tuning frequency system while maintaining a variable frequency offset between the RF generators.

SUMMARY OF THE INVENTION

The present invention is directed to a radio frequency (RF) generator. The RF generator includes a power source coupled to a sensor. A sensor signal processing unit is coupled to the power source and to the sensor. The sensor signal processing unit is operable to receive an input from an external source. The sensor signal processing unit controls the phase and the frequency of a RF generator through the external source.

BRIEF DESCRIPTION OF THE DRAWINGS

The present invention will become more fully understood from the detailed description and the accompanying drawings, wherein.

DETAILED DESCRIPTION OF VARIOUS EMBODIMENTS

Figure 1A:
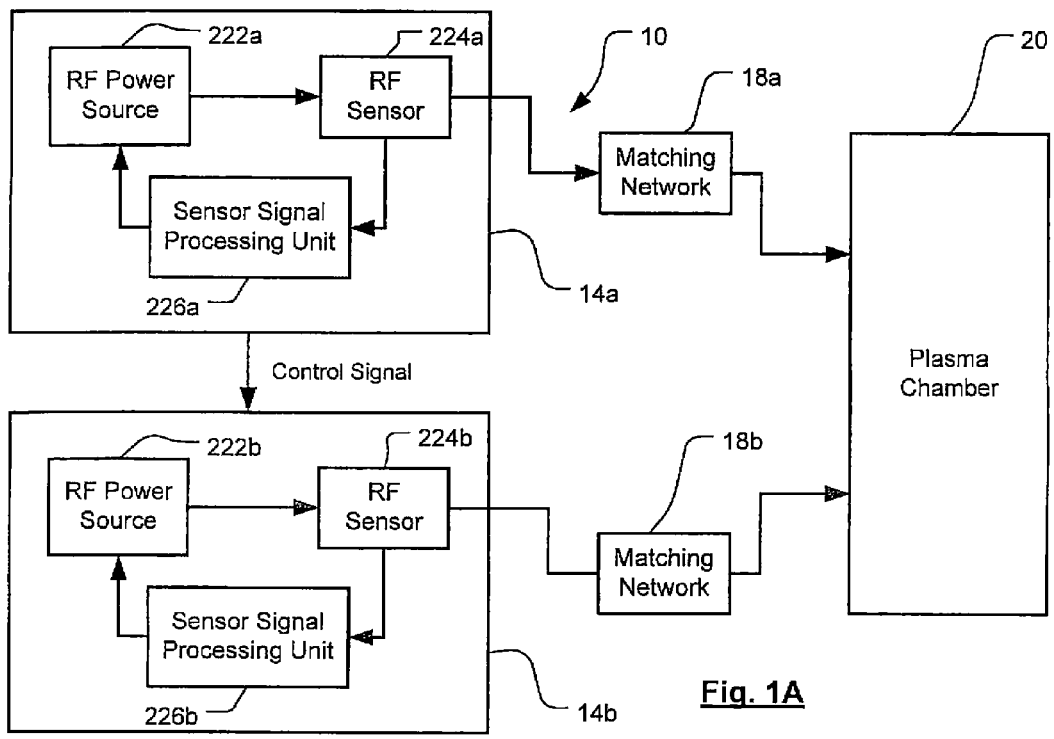
FIGS. 1A-1B are block diagrams that depict exemplary radio frequency (RF) systems according to some embodiments.

The following description of various embodiments is merely exemplary in nature and is in no way intended to limit the invention, its application, or uses. For purposes of clarity, similar reference numbers are used in the drawings to identify similar elements.

FIG. 1A depicts a plasma system 10 including a pair of radio frequency (RF) signal generators for driving a mutually exclusive load represented by plasma chamber 20. Plasma system 10 includes first and second RF generators 14a, 14b, matching networks 18a, 18b, and plasma chamber 20. RF generators 14a, 14b can implement a master-and-slave configuration using a control signal. RF generator 14a is designated the master, and RF generator 14b is designated the slave. The frequency of RF generator 14b may slaved to the frequency of RF generator 14a using a control signal sent from RF generator 14a to RF generator 146. When the control signal is absent, RF generators 14a and 14b can operate autonomously.

Figure 2:
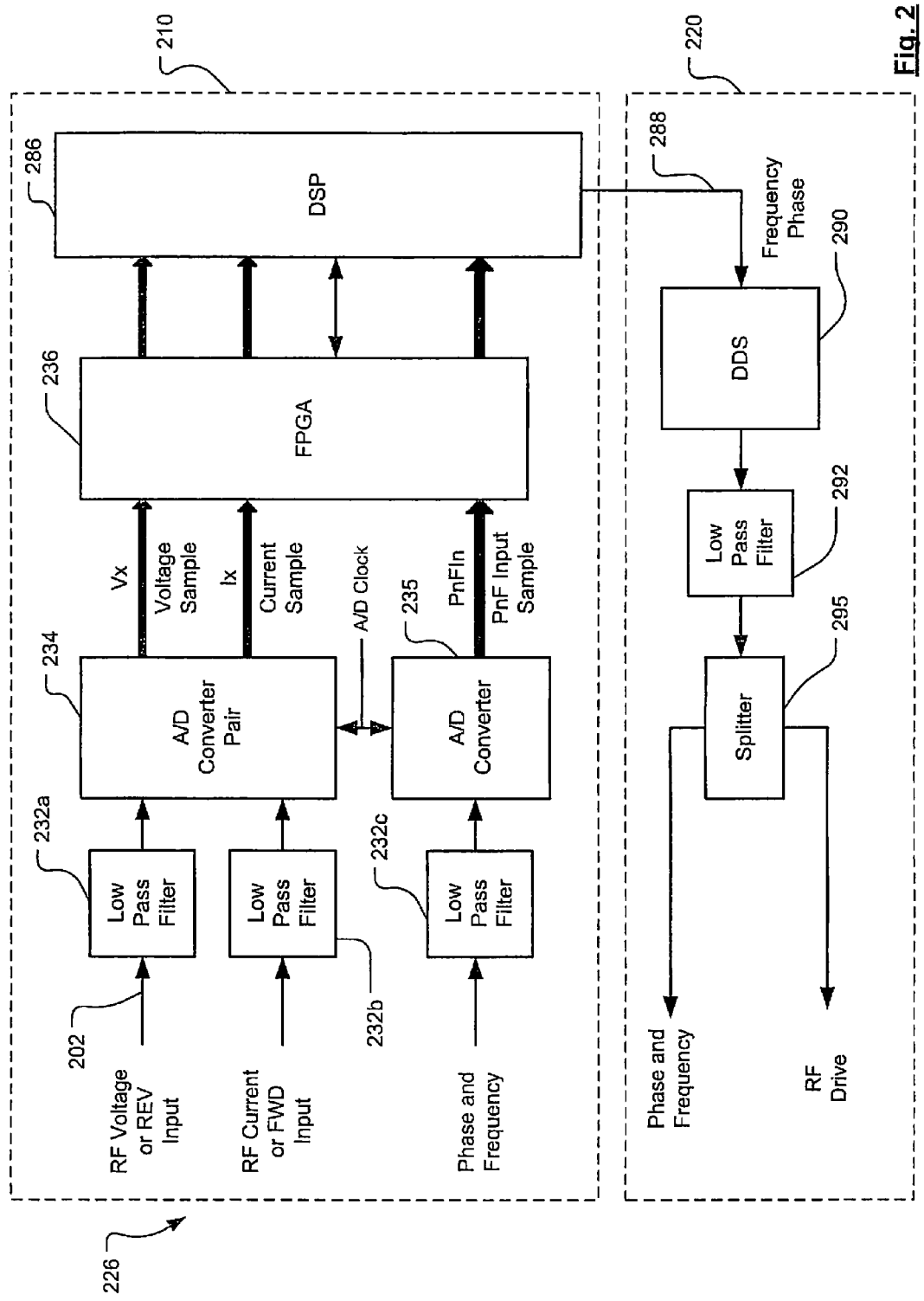
FIG. 2 is a block diagram of a sensor signal processing unit in the RF generators depicted in FIGS. 1A-1B.

RF generators 14a, 14b include respective RF power sources 222a, 222b, RF sensors 224a, 224b, and sensor signal processing units 226a, 226b. RF power sources 222a, 222b generate RF power output to respective RF sensors 224a, 224b. RF sensors 224a, 224b detect the RF power output and generate respective RF power signals that vary in accordance with the RF power. RF sensors 224a, 224b include a respective voltage probe and a current probe. These probes output a RF voltage signal 202 and a RF current signal 204, as shown in FIG. 2. Alternatively, RF sensors 224a, 224b may be directional sensors. A directional sensor has outputs that correspond to reflected power or voltage (REV) and forward power or voltage (FWD).

In some embodiments sensor signal processing units 226a, 226b can, for example, receive and bandlimit the respective signals from RF sensors 224a, 224b. This removes interfering frequency components and leaves a component of interest at a desired frequency. Sensor signal processing units 226a, 226b also control the phase and frequency relationship of the RF power for respective RF generators 14a, 14b. The RF power signals are output to respective matching networks 18a, 18b. Matching networks 18a, 18b match the impedance of plasma chamber 20 to the impedance expected by first and second RF generators 14a, 14b. This minimizes reflected power and maximizes power transfer to plasma chamber 20. In some embodiments, more than two RF generators 14a, 14b can be arranged in the mutually exclusive load configuration of FIG. 1A.

Figure 1B:
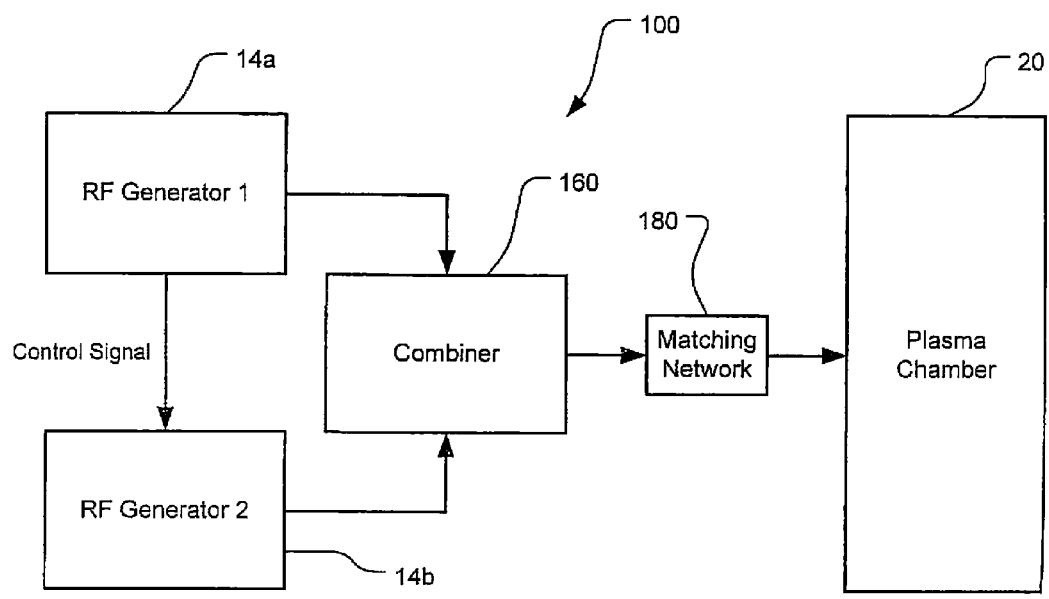

FIG. 1B depicts a plasma system 100 arranged in accordance with some embodiments and including a dual RF signal system for driving a combined load. Plasma system 100 includes first and second RF generators 14a, 14b, combiner 160, matching network 180, and plasma chamber 20. First RF generator 14a transmits a control signal to the second RF generator 14b to implement a master-and-slave configuration. RF generators 14a, 14b are configured as described above with respect to FIG. 1A. Both first and second RF generators 14a, 14b output RF power output to combiner 160.

Combiner 160 combines the RF power output and generates a single RF power output to the matching network 180. Matching network 180 matches the impedance between the RF configuration components (e.g., RF generators 14a, 14b and combiner 160) and the impedance of plasma chamber 20. In some embodiments, more than two RF generators 14a, 14b can be arranged in the combined load configuration of FIG. 1B. In some embodiments, more than two RF generators, such as shown in FIGS. 1A and 1B, can be daisy chained or paralleled.

FIG. 2 depicts an architecture for implementing a sensor signal processing unit 226a, 226b of FIGS. 1A and 1B. Sensor signal processing unit 226 includes a signal processing module 210 and a controller 220. Signal processing module 210 includes a plurality of low pass filters 232a-c, a plurality of analog-to-digital converters 234, 235, a field programmable gate array (FPGA) 236, and a digital signal processor 286. The filters described herein are implemented as low pass filters. The filters primarily control the bandwidth of the spectrum of the input signal. One skilled in the art will recognize that bandpass or high pass filters may be substituted for the low pass filters described herein. Further, filter 232c may have specifications differing from filters 232a, 232b. Low pass filter 232a receives a RF voltage signal 202 output from RF sensor 224, and low pass filter 232b receives a RF current signal 204 from RF sensor 224. One skilled in the art will recognize that the selection of the RF metrology sensor 222a, 222b determines the type of signal input to low pass filters 232a, 232b. For example a directional coupler outputs reverse power and forward power signals to low pass filters 232a, 232b. A voltage/current sensor outputs voltage and current signals to low pass filters 232a, 232b forward power (or voltage) and reverse power (or voltage), respectively, may be input to low pass filters 232a, 232b. Low pass filters 232a, 232b bandlimit the input signal to a frequency of interest received at RF voltage input 202 and RF current input 204, respectively, from sensor 224. In some embodiments, anti-aliasing filters implement low pass filters 232a, 232b. Low pass filters 232a, 232b output respective signals to an analog-to-digital (A/D) converter pair 234. A/D converter pair 234 operates at a data rate speed sufficient to process the incoming signals. A/D converter pair 234 simultaneously samples the voltage and current signal output from each low pass filter 232a, 232b. A/D converter pair 234 converts the analog input signals into corresponding digital signals output as voltage signal (Vx) and current signal (lx).

Similarly, a phase and frequency input control signal is input to low pass filter 232c. The phase and frequency input control signal input to low pass filter 232c can contain one or both of phase and frequency information. In some embodiments, sensor signal processing unit 226 is implemented in a slave RF generator, and the phase and frequency information applied to low pass filter 232c provides the control signal, such as output from RF generator 14a of FIG. 1a. In some embodiments, a master RF generator, such as RF generator 14a of FIG. 1a, may include a sensor signal processing unit 226 as configured in FIG. 2. However, in such an embodiment, no phase and frequency information is not always input to low pass filter 232c of sensor signal processing unit 226. More specifically, in some embodiments, RF generator 14a functions as the master and RF generator 14b functions as the slave. It should be recognized by one skilled in the art, however, that a plasma control system may generate set point information to either or both of master RF generator 14a and slave RF generator 14b. The set point information includes at least power level, frequency offset, and phase offset information. In addition to the set point information provided by a master plasma control system (not shown), the master RF generator generates the frequency and phase signals from controller 220 to slave RF generator 14b, which is input to low pass filter 232c. The frequency and phase signal is generated by the master from a sample of the RF power amplifier drive circuit. A splitter provides any necessary isolation and attenuation. The information input to low pass filter 232c contains an absolute frequency and an absolute phase for defining the base frequency and phase for operation of the slave RF generator. This information works in conjunction with the set point information provided by the master plasma control system, namely power level, frequency offset, and phase offset.

Low pass filter 232c may be implemented as an anti-aliasing filter. The filtered signal is then input to A/D converter 235. The phase and frequency input control signal is utilized when the detector circuit is enabled and detects the presence of the input control circuit. Determining the frequency input control signal requires calibration. A U.S. National Institute of Standards & Technology (NIST) traceable frequency/time standard provides a baseline for performing this calibration. A/D converter 235 samples the filtered signal at a predetermined clock rate. In some embodiments, the sampling rates are implemented through an A/D clock generator (not shown) that simultaneously generates an A/D clock signal to A/D converter pair 234 and to A/D converter 235. A/D converter 235 generates a digital output signal PnFIn representative of the phase and frequency of the input signal.

Signals output from A/D converter pair 234 and A/D converter 235 are input to FGPA 236 or other programmable device for large scale integration. FPGA 236 reduces the sample rate of A/D converter pair 234 and A/D converter 235 to a data rate sufficient for processing by digital signal processor (DSP) 286. DSP 286 is adapted to generate a control signal 288 that can control the phase and/or frequency of RF generators, such as RF generators 14a, 14b of FIGS. 1A and 1B. Control signal 288 is output to controller 220.

Controller 220 includes direct digital synthesizer (DDS) 290, low pass filter 292, and splitter 295. DDS 290 is a conventional digital circuit configured to generate a frequency and phase tunable output signal based upon input signal 288. DDS 290 outputs a signal to low pass filter 292. In some embodiments, low pass filter 292 is implemented as an anti-aliasing filter. Low pass filter 292 removes spurious frequency components from the signal. The filtered signal output by low pass filter 292 is input to a splitter 295, which is implemented as a power splitter. Splitter 295 outputs a phase and frequency control signal and a RF drive signal. The phase and frequency control signal controls RF generators such as RF generators 14a, 14b to vary the phase and/or the frequency of RF generators. The RF drive signal ensures that the RF generators 14a, 14b are activated or turned "on". The RF drive signal is output to matching networks 18a, 18b of FIG. 1A or to combiner 160 of FIG. 1B.

Figure 3:
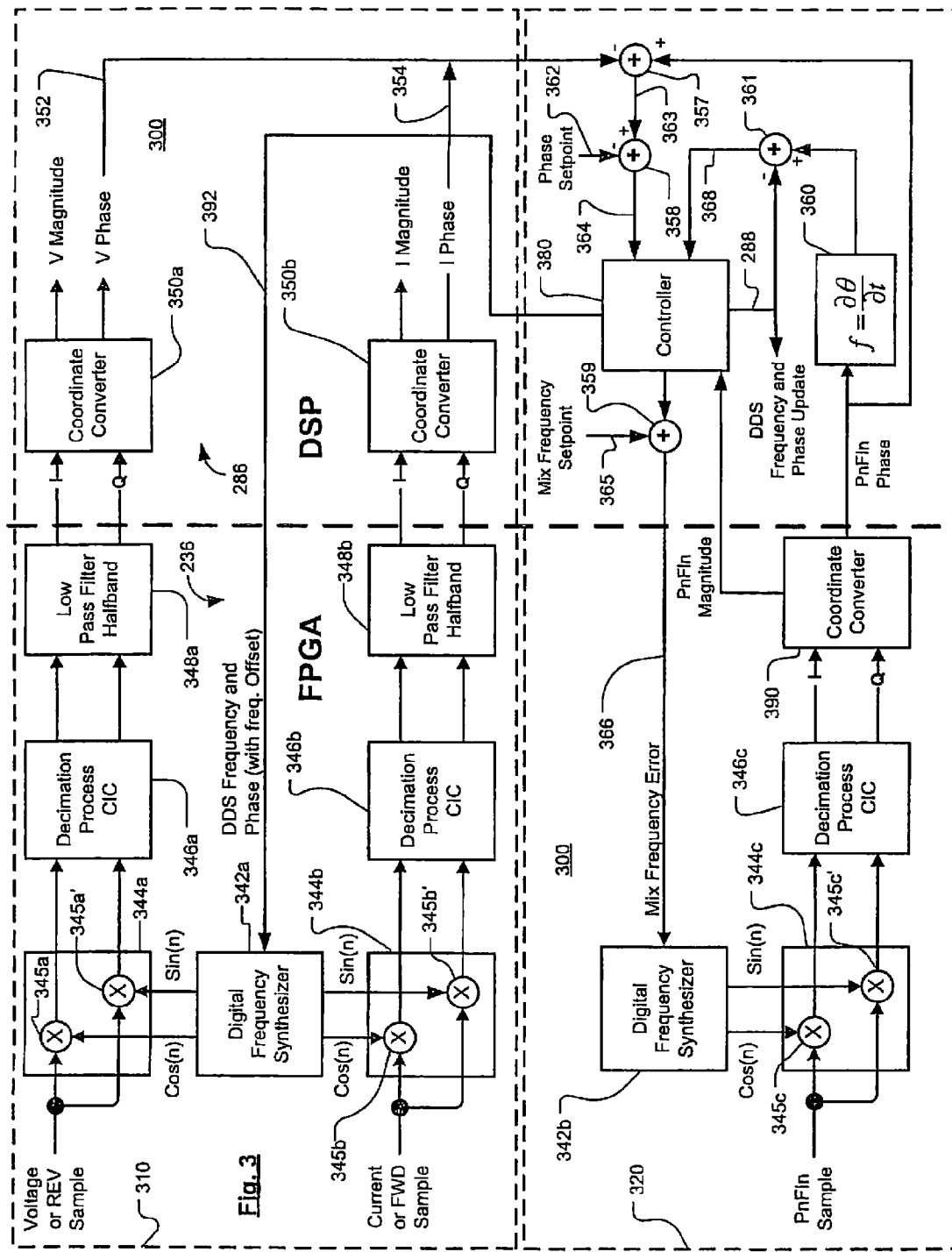
FIG. 3 is a block diagram of a signal processing architecture according to some embodiments.

FIG. 3 depicts an expanded block diagram 300 of a portion of signal processing unit 226. FIG. 3 describes the relationship between FPGA 236 and DSP 286 of FIG. 2 to control the phase and/or frequency of RF generators 14a, 14b. Signal processing module 226 includes a voltage/current signal processing unit 310 and a phase/frequency processing unit 320. One skilled in the art will recognize that voltage/current processing unit 310 may alternatively process reverse/forward signals from the appropriate RF metrology sensor. Voltage/current signal processing unit 310 removes undesirable frequency components from the frequency of interest, leaving the frequency of interest. Voltage/current signal processing unit 310 includes a pair of mixing modules 344a, 344b, a digital frequency synthesizer 342a, a pair of decimation modules 346a, 346b, a pair of low pass filters 348a, 348b, and a pair of coordinate converters 350a, 350b.

Digital signals acquired from A/D converter pair 234, shown in FIG. 2, are applied to respective mixing modules 344a, 344b. Mixing modules 344a, 344b also receive two inputs from the digital frequency synthesizer 342a. Digital frequency synthesizer 342a generates mixing signals. The mixing signals are sine and cosine waveforms representative of the frequency setpoint. The frequency setpoint correlates to the frequency of interest. In some embodiments, the frequency setpoint is a frequency offset received from a controller 380 of phase and frequency processing unit 320. Mixing modules 344a, 344b combine the mixing signals with the signals received from A/D converter pair 234. Digital mixing modules 344a, 344b each include two multipliers 345a, 345a'; 345b, 345b'. Mixing modules 344a and 344b generate signals with a spectrum constructed from the sum and difference of the frequencies contained in the sampled input signals and the signals provided by digital frequency synthesizer 342a. Translation of the sample rate to a manageable data rate occurs in decimation modules 346a, 346b. Decimation is achieved via a cascaded integrator comb (CIC) filter, but other decimation approaches may be implemented to reduce the data rate. One skilled in the art will recognize that the components of voltage/current processing unit 310 may be implemented digitally.

Decimation modules 346a, 346b generate a reduced data rate signal to respective low pass filters 348a, 348b. Low pass filters 348a, 348b provide a shaping function of the spectral output of respective decimation modules 346a, 346b. In some embodiments, a nineteen tap halfband filter may implement low pass filter 348a, 348b. Low pass filters 348a, 348b output an in-phase (I) signal and a quadrature (Q) signal for each of the digital power signals input into coordinate converters 350a, 350b, respectively. Coordinate converters 350a, 350b convert the I and Q signal data for the respective voltages and current input signals from Cartesian to Polar coordinates. Coordinate converters 350a, 350b output phase and magnitude signals for the respective voltage and current input signals. The voltage and current phase signals are applied to phase and frequency processing unit 320 to enable determination of a phase error signal. One skilled in the art will recognize that coordinate converters 350a, 350b can reside in FPGA 236. In some embodiments the coordinate converters 350a, 350b, 390 can be consolidated into one coordinate converter. Such consolidation digitally synchronizes and temporarily multiplexes the three complex input signals.

The magnitude signal can be used as a detection mechanism to allow a transfer from internal control of the RF to an external source. The phase component is used for phase control with respect to the RF sensor phase. The sensor phase is represented by voltage phase and current phase. The controlled phase of the RF sensor can be any predefined linear combination of sum (voltage phase+current phase), difference (voltage phase−current phase), or individual phase value (voltage phase or current phase). FIG. 3 does not explicitly describe any specific one of these limited combinations. Voltage and current signals used herein are used to indicate the output of a voltage and current RF sensor. The phase component can be used to determine the frequency of the phase and frequency input control signal, as shown input to low pass filter 232c of FIG. 2.

Phase and frequency processing unit 320 includes digital mixing module 344c, decimation module 346c, derivation module 360, controller 380, digital frequency synthesizer 342b, coordinate transformer 390, and summers 357, 358, 359, 361. PnFIn input signal, obtained from sampling of A/D converter 235 (shown in FIG. 2), is input to mixing module 344c of FPGA 236. Mixing module 344c includes two digital mixers 345c, 345c' that receive the PnFIn signal. Mixer 345c also receives a cosine input from digital frequency synthesizer 342b for multiplication with the PnFIn signal. The PnFIn signal is also multiplied by multiplier 345c' with a sine signal output by digital frequency synthesizer 342b. The product output by multiplier 345a represents the real component (I) of a complex waveform. The product output by multiplier 345c' represents the imaginary component (Q) of a complex waveform. The complex waveform has a predefined phase offset. The output from multiplier 345c contains the sum of the frequencies of the PnFIn input signal and the DFS 342b signal; and the output from multiplier 345c' is the difference of the frequencies of the PnFIn input signal and the DFS signal. Digital mixing module 344c outputs these signals to decimation module 346c.

Decimation module 346c reduces the data rate of the two product signals. The real I and imaginary Q components of the waveform pass through a digital filter in decimation module 346c. A CIC filter implements the digital filter since it is able to efficiently perform several functions. For example, the bandwidth of the CIC filter accommodates the offset frequency and allows the control loop to track the input frequency before digital frequency synthesizer 342b is updated with a new frequency setting through mix frequency error 366. The CIC filter also reduces the incoming sampling rate to a more manageable sampling rate. The digital filter is connected to a coordinate converter 390.

Coordinate converter 390 converts the filtered complex waveform represented by I and Q from Cartesian form to Polar form. Coordinate converter 390 outputs the magnitude and phase of the PnFIn sample to controller 380 and to frequency derivation module 360, respectively. The magnitude of the PnFIn signal provides a detection mechanism which allows transfer from an internal control of a RF source to an external source. That is, if the magnitude signal output from coordinate converter 390 is below a threshold, the RF source receiving the magnitude signal is controlled internally. A threshold magnitude is established for each type of RF generator 14a and 14b to switch between internal to external control.

Derivation module 360 determines the frequency, which is the frequency set point, of the PnFIn signal by determining the derivative of the phase with respect to time. The derivative provides the rate of rotation through a complex coordinate system. This rate is directly proportional to the decimated frequency for the difference between the frequency of the sampled input signals and the digital frequency synthesizer 342b. The derived frequency may also be a filtered version of the derivative of the sampled input signal with respect to time. For instance, the derivative is calculated with respect to time for the signal and is then optionally filtered by a linear (average) or a nonlinear (median) filter. Derivation module 360 outputs the value of the frequency to summer 361.

Summer 361 sums the output of the frequency derived by the derivation module 360 and the input signal desired frequency 288 that the RF system seeks to achieve. The sum output by summer 361, referred to as frequency error 368, is input to controller 380. Controller 380 detects changes in the frequency of the PnFIn sample using frequency error 368. A frequency error 368 of zero indicates that the frequency remains constant. A value other than zero indicates that the frequency is changing. Controller 380 tracks changes in the frequency. Controller 380 also updates digital frequency synthesizer 342a with the DDS frequency and phase offset 392 of the input signal. This frequency and phase offset 370 is the desired frequency 288 with a frequency offset.

Mix frequency set point 365 and a signal from controller 380 are applied to summer 359. Mixed frequency set point 365 is an input from an external source. In some embodiments, the external source is a user defined input. Mix frequency set point 365 specifies changes in the frequency. The sum of summer 359 is the mix frequency error 366, which is fed back to digital frequency synthesizer 342*b*. The mix frequency error 366 signal changes the set point to digital frequency synthesizer 342*b*. In this manner, the frequency of a RF generator 14*a*, 14*b* is controlled.

In some embodiments, an external source controls the phase of RF power generators 14*a*, 14*b*. In addition to being input to derivation module 360, the polar representation of the phase of the PnFIn signal also is input to a summer 357. In the digital domain, summer 357 determines a phase difference as the difference between the phase detected for the PnFIn signal and either the voltage phase ($V_{PHASE}$) or the current phase ($I_{PHASE}$). Optionally, $V_{PHASE}$ and $I_{PHASE}$ may be combined and then added to summer 357. Alternatively, $I_{PHASE}$ may be subtracted from the $V_{PHASE}$. One skilled in the art will recognize that a directional coupler may be substituted for the voltage/current sensor described herein. Accordingly, a reverse signal substitutes for voltage and a forward signal substitutes for current.

Summer 358 receives the phase difference signal output by summer 357 and a phase set point 362. Phase set point 362 is a constraint that controls the RF power signal to a certain phase offset. The phase offset may be varied while the frequency is fixed or agile. Phase set point 362 is an input from an external source, such as a user defined input. Phase set point 362 and phase difference 363 are compared at summer 358 to produce a phase error 364. Phase error 364 is the phase offset. Phase error 364 is input to controller 380. Controller 380 provides DDS 290 of FIG. 2 with frequency and phase data, which controls the RF generators 14*a*, 14*b*.

While one of a number of various embodiments of the system have been disclosed, various alterations can be made which fall within the scope of the present invention. For example, RF generators 14*a*, 14*b* may be fixed frequency generators or, alternatively, may be agile frequency generators. The agile frequency generator varies the frequency in order to maximize power transfer from the respective RF generator to plasma chamber 20. The present invention has numerous applications. For example, the phase and frequency of RF power signals may be controlled by using a phase lock loop (PLL). The PLL may be implemented in an analog circuit, a digital circuit, or a combination thereof. Additionally, while the figures depict two RF generators, the present invention may be applied to any number of RF generators. For example, controller 220 of FIG. 2 may be replicated in each RF generator. For multiple RF generators, the signals are daisy chained or paralleled. In another of the various embodiments, the digital filter used in decimation process 346*a-c* may be a polyphase filter. In still yet another of the various embodiments, a low pass filter followed by a downsampler may comprise the digital filter.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A radio frequency (RF) generator comprising:
   a RF power source;
   a sensor coupled to the RF power source;
   a sensor signal processing unit coupled to the power source and to the sensor, the sensor signal processing unit receiving a control input from an external RF generator and to generate a control signal to control at least one of phase or frequency of the RF generator.

2. The RF generator of claim 1, wherein the control input is one of a phase set point or a mix frequency set point.

3. The RF generator of claim 2, wherein the external RF generator includes a user defined input.

4. The RF generator of claim 1, wherein the sensor signal processing unit comprises a field programmable gate array (FPGA) unit and a digital signal processing unit.

5. The RF generator of claim 4, wherein the FPGA unit is operable to receive a phase and frequency input signal.

6. The RF generator of claim 4, wherein the signal processing unit is operable to generate the control signal.

7. A radio frequency (RF) generator comprising:
   means for generating RF power;
   sensor means coupled to the power source; and
   a sensor signal processing means coupled to the means for generating RF power the sensor means, the sensor signal processing means adapted to receive an input from an external RF generator means and to generate a control signal to control at least one of phase or frequency of the RF generator.

8. A first radio frequency (RF) generator comprising:
   a first RF power source that generates an RF power output;
   a first sensor that generates at least one sensor signal based on the RF power output;
   a first signal processing unit that generates magnitude and phase signals associated with the at least one sensor signal; and
   a second signal processing unit that generates a first control signal to control a frequency and a phase of the first RF power source based on the magnitude and phase signals, wherein the first RF power source determines, based on the magnitude signals, whether to generate the RF power output in response to the first control signal or in response to a second control signal received from a second RF generator.

9. The first RF generator of claim 8 wherein the first signal processing unit generates the magnitude and phase signals based on setpoint information.

10. The first RF generator of claim 9 wherein the first signal processing unit generates the magnitude and phase signals according to a frequency of interest indicated in the setpoint information.

11. The first RF generator of claim 9 wherein the setpoint information includes at least one of a power level, a frequency offset, and a phase offset.

12. The first RF generator of claim 9 wherein the second signal processing unit generates the setpoint information.

13. The first RF generator of claim 8 wherein the at least one sensor signal corresponds to at least one of:
    a voltage and a current of the RF power output; and
    a forward and reverse characteristic of the RF power output.

14. The first RF generator of claim 8 wherein the magnitude signals correspond to at least one of a magnitude of a voltage and a magnitude of a current.

15. The first RF generator of claim 8 wherein the first RF power source determines whether to generate the RF power output in response to the first control signal or in response to the second control signal based on a comparison between at least one of the magnitude signals and a threshold.

16. The first RF generator of claim 8 wherein the second control signal is based on a user defined input.

17. A method for operating a first radio frequency (RF) generator, the method comprising:
- generating an RF power output using a first RF power source;
- generating at least one sensor signal based on the RF power output;
- generating magnitude and phase signals associated with the at least one sensor signal;
- generating a first control signal to control a frequency and a phase of the first RF power source based on the magnitude and phase signals; and
- determining, based on the magnitude signals, whether to generate the RF power output in response to the first control signal or in response to a second control signal received from a second RF generator.

18. The method of claim 17 further comprising generating the magnitude and phase signals based on setpoint information.

19. The method of claim 18 further comprising generating the magnitude and phase signals according to a frequency of interest indicated in the setpoint information.

20. The method of claim 18 wherein the setpoint information includes at least one of a power level, a frequency offset, and a phase offset.

21. The method of claim 17 wherein the at least one sensor signal corresponds to at least one of:
- a voltage and a current of the RF power output; and
- a forward and reverse characteristic of the RF power output.

22. The method of claim 17 wherein the magnitude signals correspond to at least one of a magnitude of a voltage and a magnitude of a current.

23. The method of claim 17 further comprising determining whether to generate the RF power output in response to the first control signal or in response to the second control signal based on a comparison between at least one of the magnitude signals and a threshold.

24. The method of claim 17 wherein the second control signal is based on a user defined input.

25. The method of 17 comprising:
- configuring the first RF generator as a slave RF generator; and
- configuring the second RF generator as a master RF generator.

* * * * *